US006795470B1

(12) United States Patent
Spilios

(10) Patent No.: US 6,795,470 B1
(45) Date of Patent: Sep. 21, 2004

(54) SEMICONDUCTOR LASER LIGHT SOURCE WITH PHOTOCURRENT FEEDBACK CONTROL FOR SINGLE MODE OPERATION

(75) Inventor: Riyopoulos Spilios, Rockville, MD (US)

(73) Assignee: Science Applications International Corporation

( * ) Notice: Subject to any disclaimer, the term of this patent is extended or adjusted under 35 U.S.C. 154(b) by 0 days.

(21) Appl. No.: 09/328,290

(22) Filed: Jun. 9, 1999

(51) Int. Cl.[7] .................................................. H01S 5/02
(52) U.S. Cl. ............................................ 372/46; 372/45
(58) Field of Search ........................... 372/46, 103, 45, 372/43

(56) References Cited

U.S. PATENT DOCUMENTS

| 5,216,685 | A | * | 6/1993 | Asada | 372/45 |
| 5,568,499 | A | * | 10/1996 | Lear | 372/45 |
| 5,757,837 | A | * | 5/1998 | Lim et al. | 372/50 |
| 6,021,146 | A | * | 2/2000 | Jiang et al. | 372/46 |

OTHER PUBLICATIONS

Chuang, "Physics of Optoelectronics Devices," John Wiley, Interscience, (1995), pp. 465–469, No Date.
Singh, "Semiconductor Optoelectronics," McGraw Hill, (1995), pp. 534–537, No Date.
Choquette and Hou, "Vertical–Cavity Surface Emitting Lasers: Moving from Research to Manufacturing," Proceedings of the IEEE, vol. 85, No. 11, Nov. 1997, pp. 1730–1737.
Giboney, Aronson and Lemoff, "The ideal light source for datanets," IEEE Spectrum, Feb. 1998, pp. 43–53.

* cited by examiner

*Primary Examiner*—Paul Ip
*Assistant Examiner*—Dung Nguyen
(74) *Attorney, Agent, or Firm*—Banner & Witcoff, Ltd.

(57) ABSTRACT

A semiconductor laser, for example a Vertical Cavity Surface Emitting Laser (VCSEL), includes one or more photoactive layers to improve the fundamental mode operation of lasing. The photoactive layer(s) provides on-axis current channeling, resulting from the selective drop in resistance around the center of the photoactive layer(s) due to photo-excitation, and counteracts"hole burning" (i.e. carrier depletion) of the center axis region of the VCSEL cylinder. The photoactive layer(s) act as a variable resistivity screen (s) whose radial aperture is controlled by the light itself. The absorption of a small fraction of the light intensity suffices for significant on-axis current peaking with minimum efficiency loss and optical mode distortion. Thus, the VCSEL has optically pumped photoactive layers that induce significant, self-regulated, on-axis current channeling and fundamental mode stability at high operation current, improving lasing operation. Further, the VCSEL photoactive layers may be fabricated using molecular beam epitaxy and thus do not require wafer post processing.

27 Claims, 12 Drawing Sheets

SEMICONDUCTOR LASER LIGHT SOURCE WITH PHOTOCURRENT FEEDBACK CONTROL FOR SINGLE MODE OPERATION

BACKGROUND OF THE INVENTION

1. Technical Field of the Invention

This invention relates generally to light sources in the field of optoelectronics. More particularly, the invention relates to semiconductor laser light sources that includes photoactive material layer(s).

2. Description of the Related Art

Semiconductor laser light sources are key components in the rapidly expanding field of optoelectronics. The properties of high packing density, large scale integration into microchips, and low manufacturing cost make Vertical Cavity Surface Emitting Lasers (VCSELs) in particular uniquely attractive for applications, such as massive parallel computing, interconnects capable of up to THz (Tera ($10^{12}$)) bandwidth, and optical information storage technologies.

A standard mesa type VCSEL, is shown schematically as a cross section in FIG. 1, and includes a group of n-doped semiconductor segments 1, a group of p-doped semiconductor segments 2, and an active region 3 for light emission. The groups of n-doped and p-doped semiconductor segments, 1 and 2, are each commonly referred to as Bragg mirrors. Bragg mirror 1 has, for example, alternating n-doped semiconductor layers of high refraction index N-Al$_x$Ga$_{1-x}$As (4, 6, 8,10) and low refraction index N-Al$_y$Ga$_{1-y}$As (5, 7, 9) formed as a periodic sequence or periodic arrangement of layers. Bragg mirror 2 has, for example, alternating p-doped semiconductor layers of high refraction index P-Al$_x$Ga$_{1-x}$As (11, 13, 15,17) and low refraction index P-Al$_y$Ga$_{1-y}$As (12, 14, 16) and a metal conductor layer 18. The active region 3 includes, for example, a layer of N-Al$_y$Ga$_{1-y}$As 19, one (or more) active layers (Quantum Wells QW) of low band-gap p-GaAs 20, and a layer of P-Al$_y$Ga$_{1-y}$As 21 formed sequentially and disposed between Bragg mirror 1 and Bragg mirror 2.

In the typical VCSEL, an electron current $J_e$ and a hole current $J_p$ flow in opposite directions through n-doped GaAs semiconductor segments of Bragg mirror 1 and p-doped GaAs semiconductor segments of Bragg mirror 2 until they reach the active region ($\lambda$) 3 formed by one or more thin layers of a third semiconductor material sandwiched between the n-doped Bragg mirror 1 and the p-doped Bragg mirror 2. The active region 3 provides light emission via electron-hole pair recombination. The envelope of the radiation profile is characterized by the diameter 2w, w being the radiation waist. The active region 3 material has a smaller energy gap than the semiconductor material of the abutting Bragg mirrors so that (a) the emitted frequency will not be reabsorbed outside the active region and (b) a potential well forms at the p-n junction greatly increasing the carrier density there. The carrier density in the active region, and thus the photon production rate under given external current, increases by orders of magnitude when sub-micron thick active layer structures, known as quantum wells or superlattices are used.

The current-density profile and the light intensity profile in a standard, cylindrical cross-section, single mode VCSEL such as the one shown in FIG. 1, do not match. The fight intensity is peaked at the center of the cross-section (axis), as dictated by the cavity fundamental mode profile, while the current intensity is uniform across the cross section because of the uniform resistivity across the cylindrical VCSEL structure of FIG. 1. The rate of electron-hole recombination, being proportional to the emitted laser light intensity, is therefore higher near the cylinder axis than the rate of replenishment by the current, resulting in carrier depletion in the center of the cylinder.

Central carrier depletion causes undesirable mode switching of the VCSEL. As a consequence of carrier depletion (hole-burning) at the center of the cavity cross-section, currently manufactured VCSELs have a tendency to switch into higher modes at modest output power levels, when the device current is only a few times above threshold (start-up) current. The resulting change in the radiation profile is highly undesirable for a majority of optoelectronic applications.

To prevent that depletion one needs a non-uniform current profile that peaks at the center so as to provide more carriers where the carriers are consumed faster. Increasing the conductivity near the center of the cavity cross-section has been tried to counteract center cavity carrier depletion. Present methods of achieving increased carrier conductivity at the center of the cavity include ion implantation and oxide aperture techniques. Although these techniques are successful in reducing the lasing threshold they still suffer from multi-mode switching at low currents. Thus, these proposed methods do not improve mode switching.

Moreover, ion implantation and oxide aperture techniques have the disadvantage of requiring time consuming and cost increasing wafer post-processing, whereby grown wafers are removed from the growth chamber and subjected to additional processing (exposure to ion bombardment or oxidizing chemical agent). Therefore, the present VCSELs' do not provide a fabrication process that can attain the low cost associated with standard semiconductor integrated circuit VLSI processing approach.

Another important issue, also stemming from the on-axis carrier depletion, is the appearance of an optical tail after the laser current has been turned off. This is important when VCSELs are employed in producing square optical pulses in digitized optical signals or digital communications. Elimination of imperfections in the optical pulse modulation is crucial in achieving better bit-error-rate (BER); the latter sets a limit on the information transmission rate, and prevents harvesting the full optical fiber communication bandwidth.

SUMMARY OF THE INVENTION

One aspect of the invention provides a semiconductor laser with greatly improved laser operation by including photoactive material for self-regulating feedback.

Another aspect of the invention provides a semiconductor laser, for example a VCSEL, with greatly improved laser operation in the fundamental mode, and laser turn-off properties, by using at least one layer of photoactive material. The photoactive layer(s) produces a self-regulating feedback mechanism by inducing a photocurrent that mirrors the fundamental mode intensity and thus produces more carriers on axis to counteract carrier depletion ("hole burning").

Consequently one embodiment of the invention enables self-regulated mode control during Vertical Cavity Surface Emitting Laser (VCSEL) operation, preventing mode switching and thus allowing operation at the fundamental laser mode at high radiation power and at much higher device current than the start-up threshold. In addition, the present invention reduces carrier depletion on axis thereby reducing optical tails after laser bias is turned off.

In view of the above, one advantage of the present invention is to provide an improved semiconductor laser, for example a VCSEL, with photocurrent feedback.

Another advantage of the present invention is to improve a high power VCSEL operation in the fundamental cavity mode.

A further advantage of the present invention is to prevent mode switching to undesirable cavity modes in a VCSEL.

A still further advantage of the present invention is to provide a self-regulating feedback mechanism in a VCSEL that does not require outside control circuits or external user intervention.

Another advantage of the present invention is to reduce or eliminate tails in the optical laser pulse after a VCSEL turn-off.

A further advantage of the present invention is to reduce or eliminate power "spikes" and pulse modulation/frequency chirp during laser turn-on.

An additional advantage of the present invention is that its reduction to practice is fully compatible with very large scale integration (VLSI), does not require wafer post-processing, and preserves the VCSEL low cost advantage over edge emitting lasers.

A further additional advantage of using thin photoactive layer(s) is that only a small fraction of the circulating cavity power needs to be consumed to induce significant resistivity changes and current channeling so that the VCSEL operating voltage, current, and output power remain close to that found in VCSELs without photo-feedback and the photoactive layer(s) have small fractional absorption with insignificant optical mode distortion.

The photoactive layer may be formed of, for example, high band gap $Ga_{1-x}Al_xAs$, amorphous $Ga_{1-x}Al_xAs$, undoped GaAs, Ge, GeSi, and ZnSe.

As can be appreciated by one skilled in the art, the invention is relevant to semiconductor lasers in general, and more specifically to VCSEL devices, which are formed using semiconductor integrated circuit fabrication methods. However, it is inherent that the invention is also applicable to any semiconductor optics application or device wherein photocurrent feedback can be useful to enable self-regulation of the photo device.

BRIEF DESCRIPTION OF THE DRAWINGS

The above advantages, aspects, and features of the present invention will become more apparent from the following detailed description taken with the accompanying drawings in which:

FIG. 8A shows the pulse for conventional laser operation, FIG. 8B shows improved VCSEL laser start-up operation with one pair of photoactive layers, and FIG. 8C shows even further improved VCSEL laser start-up operation with two pairs of photoactive layers.

DESCRIPTION OF THE PREFERRED EMBODIMENTS

The invented method of mode control for a semiconductor laser, and more particularly to a VCSEL, is based on the principle that photoactive materials increase their charge carrier density in the conduction band in response to incident light radiation. According to one embodiment, the induced photocurrent density mirrors the laser mode intensity and peaks naturally on axis, adjusting the resistivity of the photoactive layer and thereby counterbalancing the carrier depletion that occurs in the active region. Self-regulated mode locking at the fundamental mode occurs at laser powers and currents much higher than the VCSEL start-up threshold. In addition, the method is compatible with large scale VCSEL integration into an integrated circuit, does not require individual cavity post processing, and can be produced at low wafer manufacturing cost.

Light passing through a photoactive semiconductor raises electrons from the valence to the conduction band and the number of these conduction electrons is proportional to the light intensity. As the photo-excited carrier density is proportional to the light radiation intensity, a localized reduction of resistivity on-axis ensues, providing on-axis current channeling during fundamental mode operation. The photoactive layer(s) act as variable resistive lens(es), whose aperture is regulated by the laser light itself, and the current channel adjusts very quickly to the instantaneous laser intensity profile resulting in a negative feedback mechanism. A modest fraction of radiation dissipated at the photoactive layer suffices for a significant current peaking factor. It has been determined theoretically and through numerical simulations that single mode operation at many times the threshold current can be achieved using the photoactive layer(s). A more detailed theoretical analysis of the invention is provided in the publication *Single mode VCSEL operation via Photocurrent feedback*, Proceedings of SPIE Photonics, West 1999, authored by Spilios Riyopoulos (inventor of present invention), and hereby incorporated by reference herein in its entirety. Another publication providing a more detailed theoretical analysis of the invention is, *Stable, single mode VCSEL laser with photoresistive aperture*, Optics Letters, Volume 24, Jun. 1, 1999, also authored by Spilios Riyopoulos and hereby incorporated by reference herein in its entirety.

Figure 1:
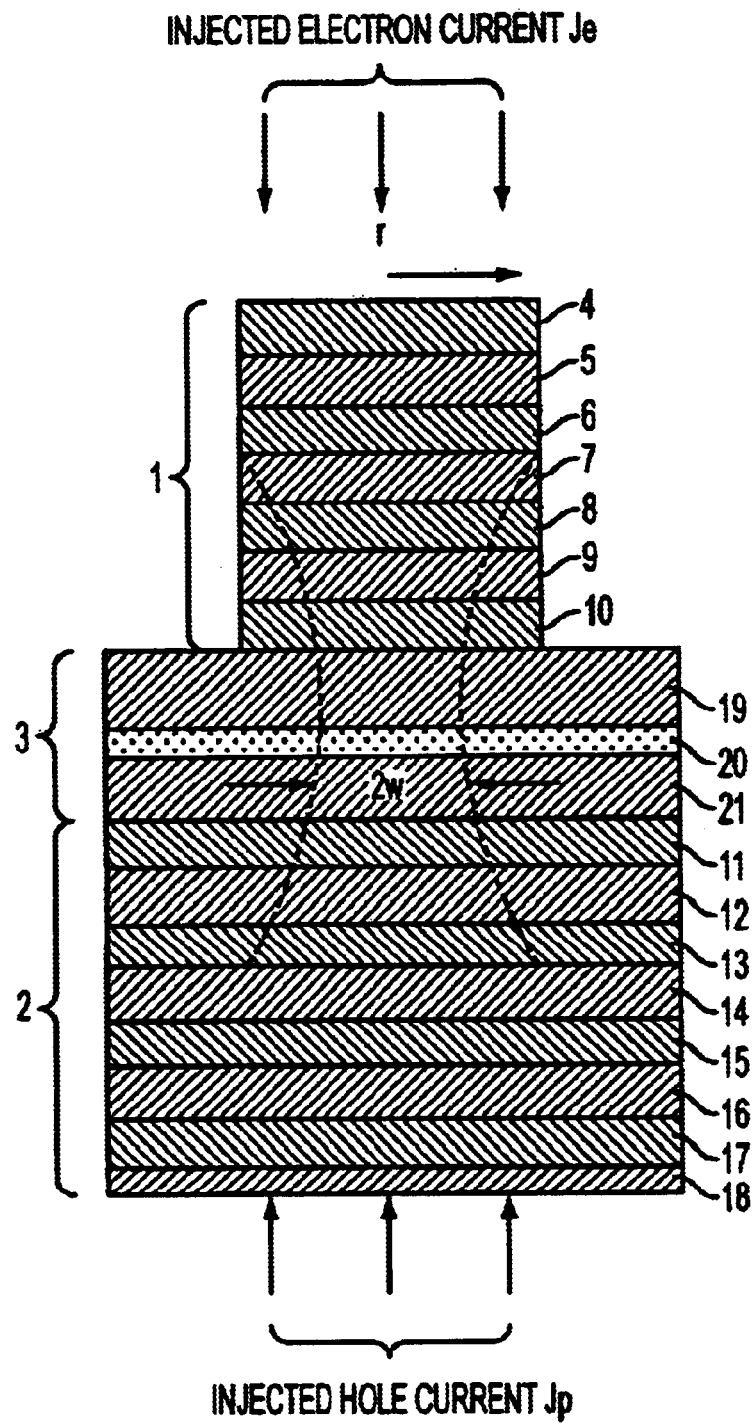
FIG. 1 is a cross-section view of a conventional "mesa type" VCSEL cavity, showing the material layers, the current flow J and the radiation envelope of waist w.
Figure 2A:
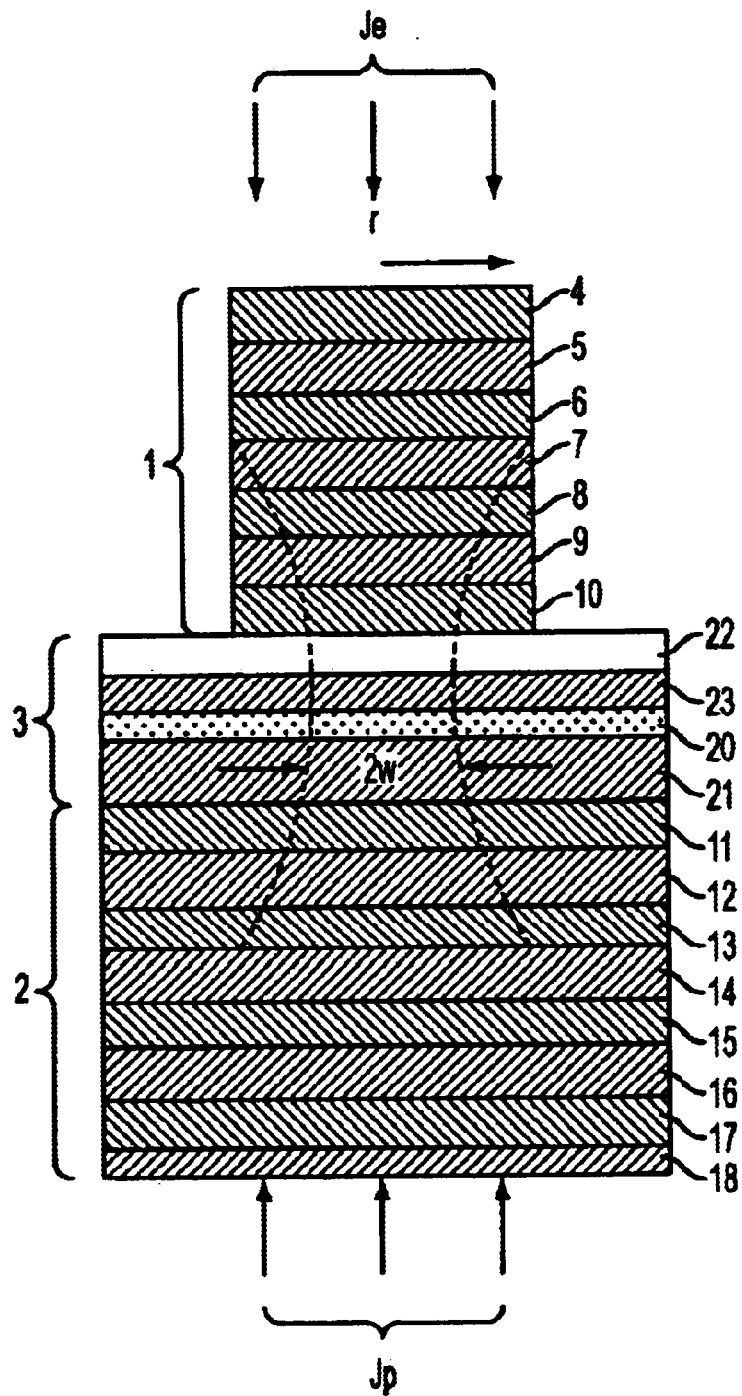
FIG. 2A illustrates a cross-section view of a first embodiment of the present invention VCSEL with photoactive layer 22.
Figure 2B:
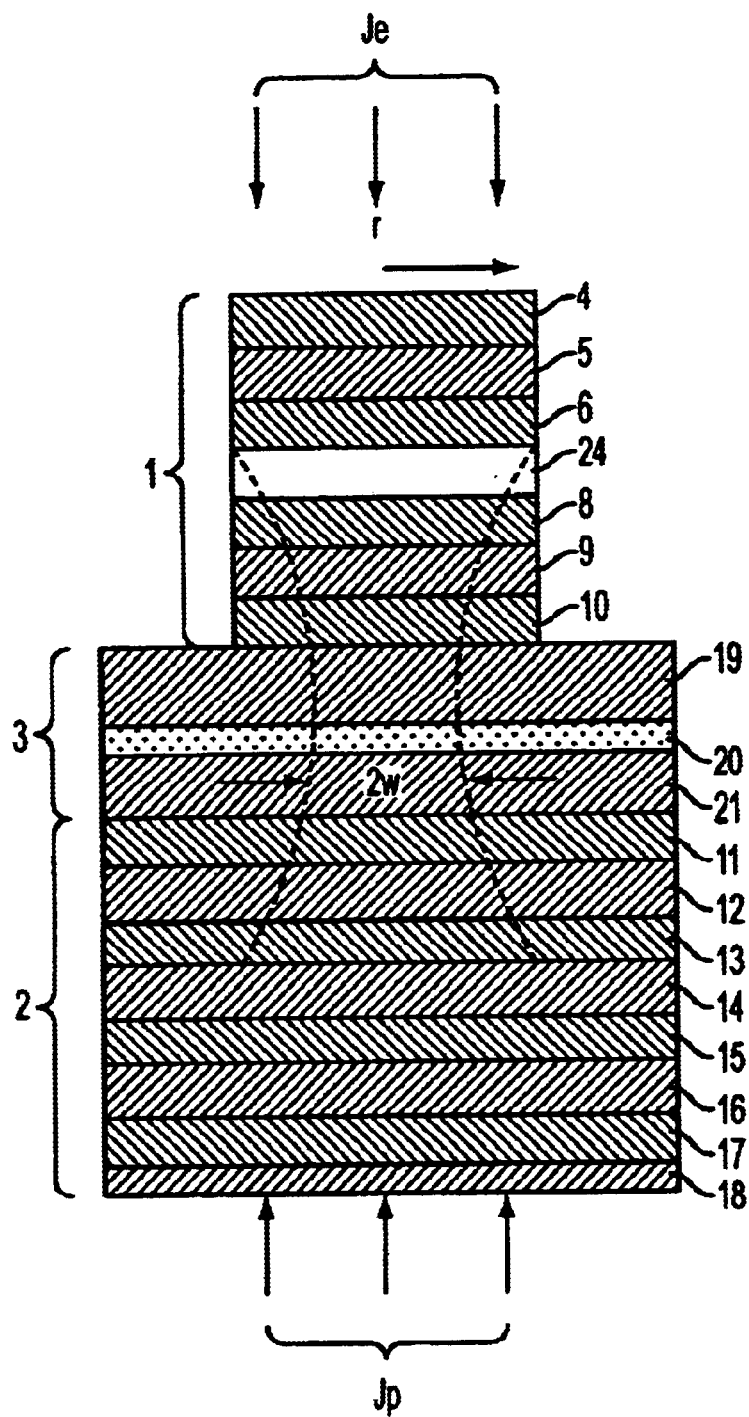
FIG. 2B illustrates a cross-section view of a second embodiment of the present invention VCSEL with photoactive layer 24.
Figure 2C:
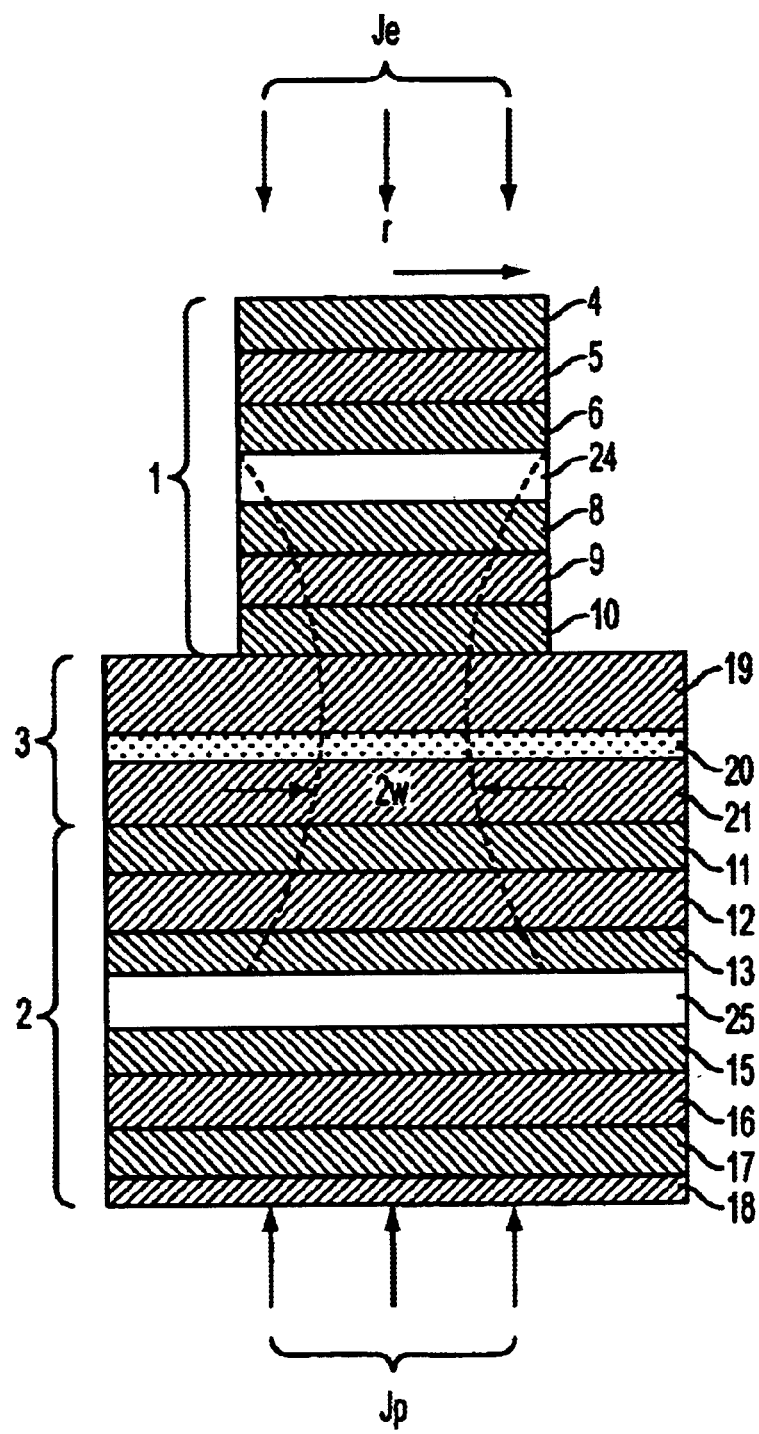
FIG. 2C illustrates a cross-section view of a third embodiment of the present invention VCSEL with photoactive layers 24 and 25.

One embodiment of the invention consists of placing thin photoactive material layer(s) in proper location(s) inside the VCSEL cavity. The function of the photoactive material is different from that of the surrounding VCSEL material layers. The photoactive material regulates the current passing through the VCSEL, as the photoactive material resistivity changes in response to the laser light intensity. On the other hand, the electric properties of the mirror layers do not change significantly with light, as their"passive" optical properties (i.e., index of refraction) act so as to confine and shape the light beam in the cavity. Three preferred embodiments of the invention are depicted in FIGS. 2A–2C, respectively, and illustrate some of the envisioned photoactive material enhanced VCSEL cavities for Gallium Arsenide (GaAs) based technology. Note that the same reference numerals used in FIGS. 2A–2C for the invented VCSEL represent the same portions of the conventional VCSEL shown in FIG. 1. Although the preferred embodiments are directed to GaAs based VCSEL devices, other arrangements and materials for the photoactive layers using different base material technology for the VCSEL are analogous and, as understood by one skilled in the art, would benefit from the teachings of the present invention.

For example, direct modifications are applicable to InP-based, GaN-based, or any III–V or II–VI element based VCSEL. In addition, proper rearrangement of the photoresistive layers can find direct application, and have the same beneficial effect, namely to counteract hole burning and ensure single mode laser operation at high power, for the so-called edge emitting semiconductor lasers. Further, use of photoresistive layers can also be used to address a similar type"hole burning" in quantum cascade lasers under development. In fact, the present invention is applicable to any other semiconductor material, for example silicon, as long as the material can be constructed to act as an optoelectronic light source.

Referring to FIG. 2A, a first embodiment of the invention includes a photoactive layer 22 introduced into the VCSEL between the n doped Bragg mirror 1 and the active layer 3. As explained later, some examples of material that may be used as the photoactive layer 22 include a high band gap $Ga_{1-x}Al_xAs$, an amorphous $Ga_{1-x}Al_xAs$, an undoped GaAs, Ge, $Ge_{0.9}Si_{0.1}$, or N-ZnSe. Layer 23 is an $N-Al_yGa_{1-y}As$ layer of the same material as layer 19 in the active layer 3 of the conventional VCSEL shown in FIG. 1. The thickness of layer 22 and layer 23 are such that the total length of the VCSEL active region remains an integer number of half-wavelengths, to form standing waves between mirrors. In this embodiment a single photoactive region is inserted into the VCSEL at one end of the Bragg mirror 1. Embodiments with a single layer in the Bragg mirror 1, or two layers, one in mirror 1 and one in mirror 2 are shown in FIGS. 2B–2C. The exact placement of the photoactive layer(s) is not crucial to the invention. However, as discussed below several factors should be consider in determining optimum photoactive layer placement.

In selecting the optimum placement in the cavity for the photoactive layer, care is taken to avoid premature photocurrent saturation and thus current"clipping" on axis (which would defeat the purpose of current profile peaking). For a given desired photocurrent density (proportional to the product of photo-active material valence electron density times light intensity), an optimum feedback results by placing photoactive materials of high responsiveness near a minimum of the light intensity in the laser cavity ("cavity" meaning the entire structure in FIGS. 2A-2C).

A second embodiment of the present invention VCSEL is illustrated in FIG. 2B. In this embodiment the photoactive layer 24 is included in the body of Bragg mirror 1 and replaces an $N-Al_yGa_{1-y}As$ layer of the conventional VCSEL (shown as layer 7 in FIG. 1).

A third embodiment of the present invention VCSEL is illustrated in FIG. 2C. In this embodiment, similar to the third embodiment, a photoactive layer 24 is included in the body of Bragg mirror 1 and replaces an $N-Al_yGa_{1-y}As$ layer of the conventional VCSEL (shown as layer 7 in FIG. 1). Further, an additional photoactive layer 25 is included in the body of Bragg mirror 2 and replaces a $P-Al_yGa_{1-y}As$ layer of the conventional VCSEL (shown as layer 14 in FIG. 1). This embodiment therefore places photoactive layers near the minimum of the laser light intensity in the laser cavity in both the n-doped Bragg mirror 1 and the p-doped Bragg mirror 2.

The arrangements of the invention as shown in FIGS. 2A and 2B use a photoactive layer placed in the n-doped section of the VCSEL. In the case of undoped material (for example, GaAs, Ge, and SiGe), for each electron raised in the conduction band there is a hole generated in the valence band. A hole in the n-section moves in the opposite direction than the electron. It might seem that a photoactive layer should always be placed in the symmetrically opposed p-doped VCSEL section, as illustrated in the third embodiment shown in FIG. 2C, so that an equal hole current reaches the active region from below. The hole and electron current densities in both segments must match to enforce current conservation. However, matching the hole and electron densities in both segments can occur automatically, as follows. The presence of the photoactive material in the n-doped side (Bragg mirror 1) drops the overall resistance in the upper half of the cavity. That means that most of the externally applied potential drop occurs across the lower half. The majority carriers there (holes) see a larger electric field than the electrons in the upper half, hence a higher hole transport speed compensates for the lower hole density. It is worth noting that there is no hole production when n-doped ZnSe is used as photoactive material.

For each embodiment there is a trade-off between optimum performance, manufacturing simplicity/cost and material selection/availability. To optimize performance in terms of maximum single mode power with minimum dissipation at the photoactive layer one can refer to the equations discussed in the author's previously cited publications. The other criteria concerning manufacturing simplicity/cost and material selection are addressed on a case-to-case basis as the user's objectives and the intended application determines such factors.

In particular, three of the equations are helpful in determining better location and thickness of the photoactive layers. The first is the equation giving the QW junction current $$J = i\left[\exp\left(\frac{e(V-JR)}{\kappa T}\right) - 1\right]$$

where J is the current density, i the "reverse bias" junction current density, e the electron charge, V the applied voltage across the laser cavity, T the absolute temperature, κ Boltzman's constant and R is the photoactive layer resistance. The second equation $$R = \frac{1}{en\mu}$$

yields the dependence of the resistance R on the photoactive layer thickness 1, photocarrier density n and carrier mobility $\mu$. The third equation $$n = \frac{\frac{\sigma}{\gamma}\zeta P}{1 + \frac{\sigma}{\gamma}\zeta P} N_D$$

yields the photocarrier density n excited from a dopant density ND by the radiation intensity P, as function of the excitation cross-section a, the decay time y and the location factor ζ.

If the VCSEL is to operate in a single mode up to power level P, the photoexcitation cross-section a and the location factor ζ are selected so that Eq. (3) yields an on-axis excited photocarrier density from ten to a hundred times the unexcited (thermal level) edge density. Equation (2) then yields an on axis resistivity drop by the same factor, compared to the initial resistivity $R_0$. The latter is such that the change ΔR entered in equation (1) causes the current density on axis J to rise by tenfold or more compared to the edge current density. Parameter optimization is an iterative process that also takes into account the laser equations describing the growth of the light intensity P and the carrier density N at the QW (known as "rate equations"). Exact optimization is best performed numerically using a computer.

The mesa type VCSEL used to illustrate the present invention can be formed using processes well known in the semiconductor art. Each layer of the VCSEL is successively formed one on the other until all layers have been completed. The photoactive layers used in the preferred embodiments may be fabricated using conventional processes, for example, molecular beam epitaxy (MBE), or metal-organic vapor deposition (MOCVD) etc. Thus, one advantage of the present invention compared to the ion implantation and oxide aperture methods described in the background section above is that the present invention does not require wafer post processing on the individual VCSEL cavity so that the processing costs are low.

One feature of the present invention that allows improved VCSEL operation is that it suffices to use thin photoactive layer(s) of the order of 0.1 μm, and thus consume only a small fraction of the circulating cavity power to induce significant resistivity changes and current channeling. The VCSEL operating voltage, current and output power remain close to that without photocurrent feedback. The overall optical efficiency is only slightly decreased, mainly by passive absorption, since (for quantum efficiency equaling one) one photon is consumed to raise one electron to the conduction band, which, upon reaching the active region, will generate one photon. The small fractional absorption at the photoresistive layer causes insignificant optical mode distortion. The degree of induced current peaking depends on the location, thickness and electronic properties of the photoactive layer, which are optimized according to the performance requirements. The current profile regulation by the radiation in the subject invention is termed photo-current feedback.

An illustrative comparison of carrier density n(r), current density J(r) and light intensity l(r) profiles for VCSEL operation, without and with the proposed photo-current feedback, respectively, is shown in FIGS. 3A–3G. Each of these figures shows a dotted line in the center of the graph that illustrates the center (axis) of the laser cavity. To the right and left of the center is the radius r of the laser cavity.

Figure 3A:
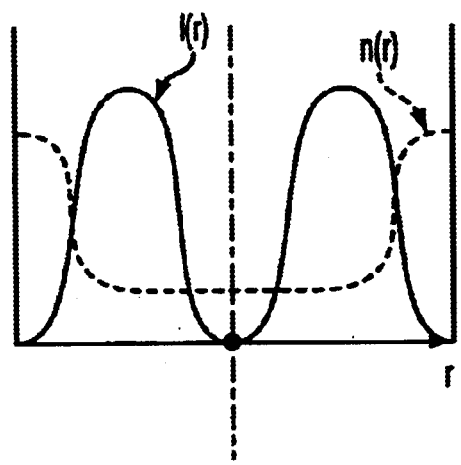
FIGS. 3A and 3B are graphs that illustrate light intensity l(r) and carrier density n(r) at high power for a conventional VCSEL and one embodiment of the present invention VCSEL, respectively.
Figure 3B:
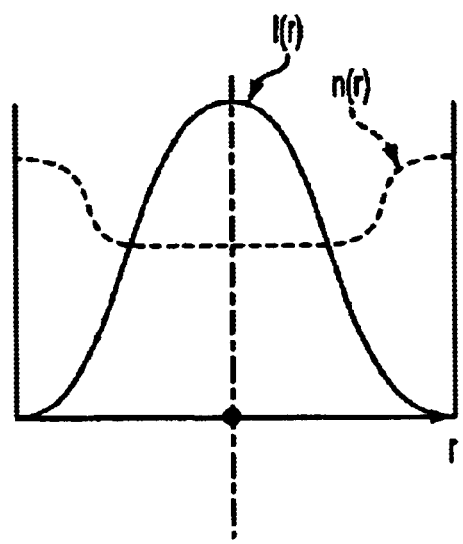

Referring now to FIGS. 3A and 3B, light intensity l(r) and current density J(r) for the laser cavity of a conventional VCSEL and an inventive VCSEL including a photoactive layer(s), respectively, is shown for VCSELs operating at relatively high power. FIG. 3A illustrates light intensity l(r) and carrier density n(r) for the laser cavity of a conventional VCSEL operating at relatively high power. As illustrated, the light intensity l(r) of the conventional VCSEL is bi-modal and dips at the axis of the laser cavity. Further, the carrier density n(r) drops to a relatively low level toward the center of the laser cavity profile.

FIG. 3B illustrates the light intensity l(r) and carrier density n(r) for the laser cavity of an inventive VCSEL including a photoactive layer(s) operating at relatively high power. As illustrated, the light intensity l(r) of the VCSEL including photoactive layer(s) is single mode and peaks at the axis of the laser cavity. Further, the carrier density n(r) remains relatively high throughout the laser cavity profile.

Figure 3C:
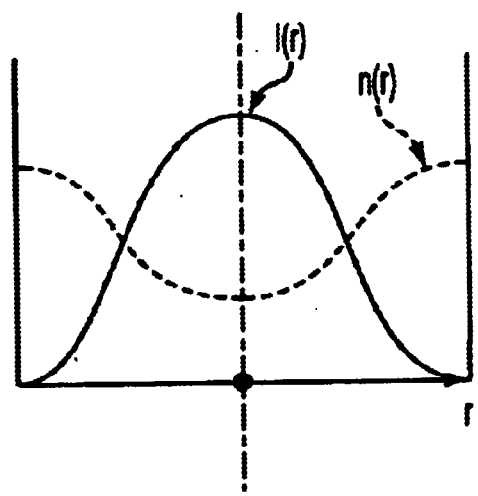
FIGS. 3C and 3D are graphs that illustrate light intensity l(r) and carrier density n(r) at low power for a conventional VCSEL and one embodiment of the present invention VCSEL, respectively.
Figure 3D:
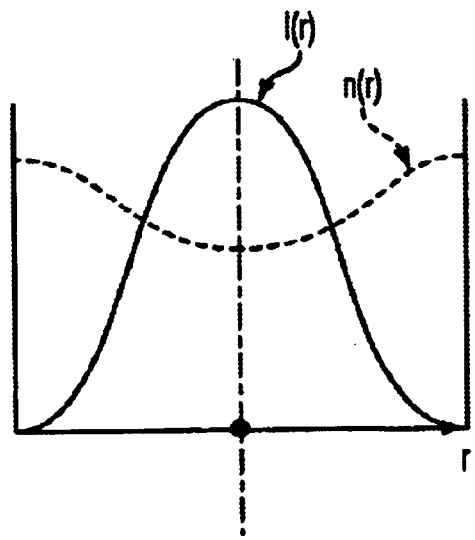

Referring to FIGS. 3C and 3D, light intensity l(r) and carrier density n(r) for the laser cavity of a conventional VCSEL and an inventive VCSEL including a photoactive layer(s), respectively, is shown for VCSELs operating at relatively low power just above the threshold current necessary for lasing. As illustrated, the light intensity l(r) and carrier density n(r) of the conventional VCSEL and an inventive VCSEL including a photoactive layer(s) are similar when operating at a relatively low power close to the threshold current because no carrier depletion occurs at such low power levels.

Figure 3E:
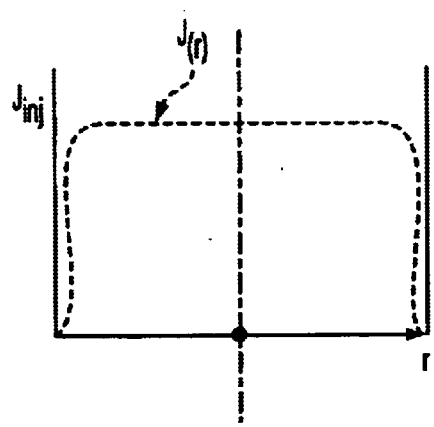
FIG. 3E is a graph that illustrates injection current density $J_{inj}$ resulting from injection current for a conventional VCSEL and a VCSEL according to the present invention.
Figure 3F:
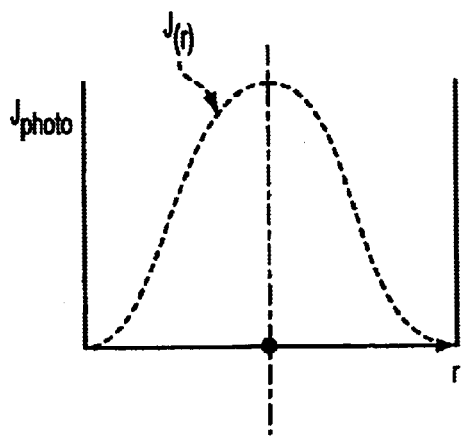
FIGS. 3F and 3G are graphs which illustrate current density $J_{photo}$ contributed by the photo-active layers and the sum total current density $J_{tot}$ for a VCSEL according to the present invention, respectively, where the $J_{tot}$ is the combined current density of the injected current density $J_{inj}$ contributed by the standard n-doped and p-doped layers and the current density $J_{photo}$ contributed by the photo-active layers.
Figure 3G:
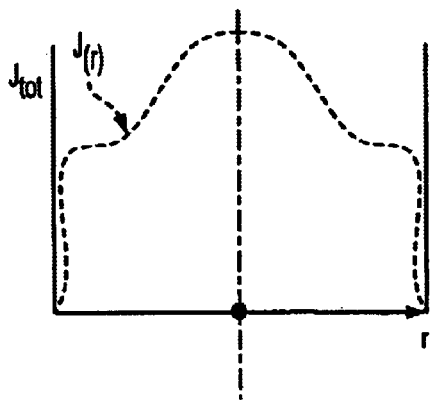

FIG. 3E illustrates the current density J(r) caused by injection current in the conventional VCSEL. This same injection current density $J_{inj}$ exists in an inventive VCSEL having a photoactive layer(s). However, as shown in FIG. 3F, an inventive VCSEL also has a photo current density $J_{photo}$ component related to the operation of the photoactive layer(s). Thus, as illustrated in FIG. 3G, an inventive VCSEL including a photoactive layer has a total current density $J_{tot}$ ($J_{inj}+J_{photo}$) which peaks on axis to counteract carrier depletion and mode switching.

Another feature of the invention is the reduction or elimination of optical tails. Optical tails have been associated with electrons rushing in to fill the axial "hole" in the carrier density, raising the carrier density above lasing threshold, after the bias has been turned off to the VCSEL. The optical tail effect can be significantly reduce, even eliminated, by introducing the thin photoactive layer that prevents the hole burning at the axis during VCSEL operation. This helps eliminate one of the factors preventing the achievement of THz frequencies with low BER (bit error rate) in optoelectronics communications.

Figure 4A:
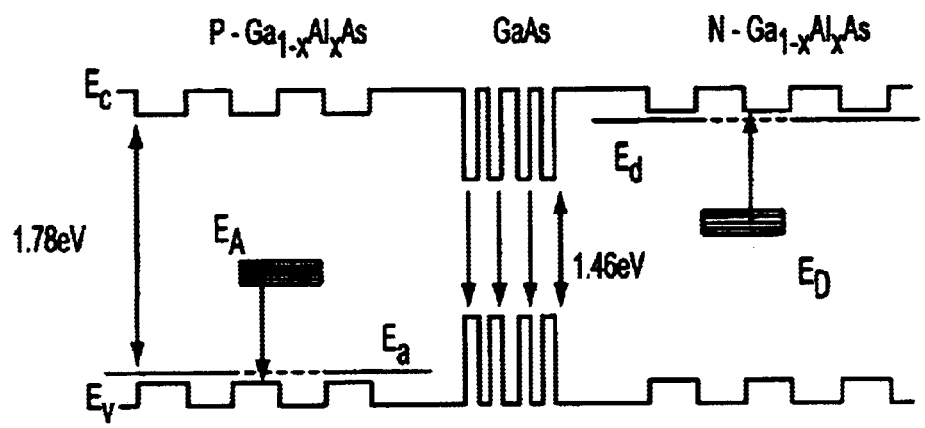
FIG. 4A is an energy diagram (with zero applied bias) of typical band-edge gaps between a GaAs-based VCSEL and deep level doped GaAs photoactive materials.
Figure 4B:
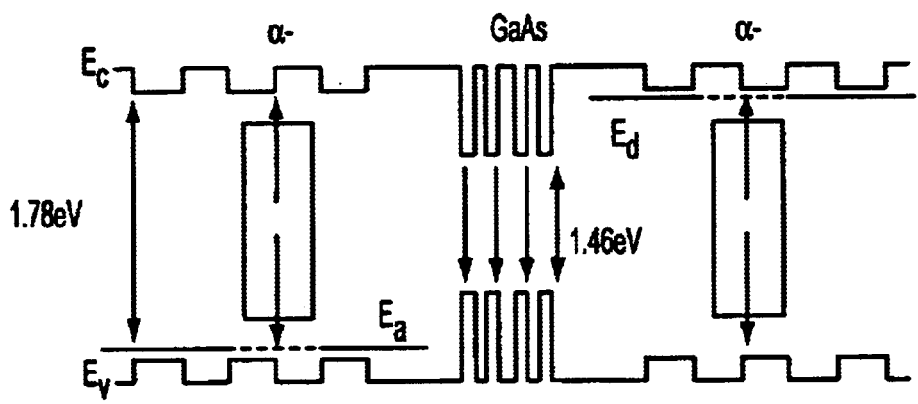
FIG. 4B is an energy diagram (with zero applied bias) of typical band-edge gaps between a GaAs-based VCSEL and amorphous AlGaAs photoactive materials.

FIGS. 4A and 4B illustrate the energy level diagrams for two types of photoactive materials that may be used for the photoactive layers placed inside the Bragg mirror stacks (as shown in FIGS. 2A–2C). Note that the embodiments use GaAs based technology herein only as an example since extrapolations for different band-gap materials are straight-forward.

FIG. 4A illustrates a band gap diagram for an inventive VCSEL using high band-gap $Ga_{1-x}Al_xAs$ as the photoactive layer(s) material. The $Ga_{1-x}Al_xAs$ is similar to the $Ga_{1-x}Al_xAs$ that is found in the conventional Bragg mirror stack but is doped differently to provide photoactive characteristics proposed for the invention. The intrinsic carrier concentration of $Ga_{1-x}Al_xAs$ is low at room temperature, practically i-type (intrinsic) semiconductor, by employing very low concentration of shallow level dopants. To achieve the high band-gap $Ga_{1-x}Al_xAs$ for the present invention, a high concentration of deep energy level donors or acceptors (for p- or n- type conductivity respectively) can be added to the standard $Ga_{1-x}Al_xAs$ starting material during the material layer deposition process using one of the standard wafer growth (MBE or MOCVD) techniques. Laser photons of energy 1.46 eV, equal to the GaAs band-gap in the QW, that cannot raise carriers directly over the 1.78 eV energy gap $Ga_{1-x}Al_xAs$, will excite carriers from the donors/acceptors energy levels within the gap to the conductivity/valence band $E_C/E_V$. As illustrated, $E_a$, $E_A$, $E_d$, and $E_D$ respectively are the shallow and deep acceptor energy levels, and the shallow and deep donor energy levels.

FIG. 4B illustrates a band gap diagram for an inventive VCSEL having amorphous $Ga_{1-x}Al_xAs$ as the photoactive layer(s) material. The band gap is not empty, but contains considerable density of intermediate "localized electron" energy levels, that can be pumped by the laser radiation to the conduction band. In effect, the localized states within the amorphous band-gap act as deep level doping.

Undoped GaAs of the same band gap as the quantum well (QW; active region) is another possible material that may be used for the photoactive layer(s) of the proposed VCSEL. However, using undoped GaAs an energy band discontinuity can form at the Bragg mirror/$Ga_{1-x}Al_xAs$ interface, creating another quantum well. Therefore, a transition regime of tapered energy gap should be employed on either side of the undoped GaAs, using $Ga_{1-y}Al_yAs$ of graded stoichiometry, y from 0 to x.

All of the materials suggested above for the photoactive layer(s) are commercially attractive for use in GaAs base material VCSEL device processing because they are closely related to the base material and well know in the art. However, other materials can provide acceptable VCSEL operation as well.

Other materials which can be applied as the photoactive layers placed at intermediate locations between the mirrors and the active layers (FIGS. 2A–2C) should satisfy the following properties: (a) lattice compatibility with GaAs, (b) smaller energy gap than that of the active region, (c) small difference in electron affinity with the GaAs. The first property allows the growth of a photoactive layer free from lattice defects in the GaAs. The second property allows electron transfer to the conduction band by photo-absorption. The third property is necessary if conduction band electrons with thermal energies are to overcome the conduction band junction barriers and flow to the active region.

The following currently available semiconductor materials can also be used for photoactive current control in GaAs-based VCSELs: Ge, GeSi and ZnSe. Their relevant properties are demonstrated in the Table I below, in comparison with those for GaAs and AlAs.

TABLE I

Properties of candidate materials for VCSEL photocurrent layer and comparison with GaAs/AlAs

|  | AlAs | GaAs | Ge | $Ge_{0.9}Si_{0.1}$ | ZnSe |
|---|---|---|---|---|---|
| Lattice constant (A) | 5.661 | 5.654 | 5.658 | 5.630 | 5.667 |
| Energy Gap (eV) | 2.15 | 1.43 | 0.66 | 0.77 | 2.67 |
| Electron Affinity (eV) | 3.50 | 4.07 | 4.13 | 4.10 | 4.09 |
| Dielectric constant | 10.1 | 11.5 | 16.0 | 15.6 | 9.1 |

Note that the usual VCSEL main compound $Al_xGa_{1-x}As$ is an admixture of $(AlAs)_x$ and $(GaAs)_{1-x}$ where x is a fraction between zero and 0.45. Undoped ZnSe cannot be used as photo-material because its band-gap is larger than that of $Al_xGa_{1-x}As$. However, its excellent lattice and electron affinity matching suggest the use of deep band doping so that electrons are raised to the conduction band from the middle of the ZnSe band gap, thus permitting the use of ZnSe in the proposed application.

Referring now to FIGS. 5A–7B, a performance comparison between the conventional VCSEL and a VCSEL according to the present invention will be discussed.

Figure 5A:
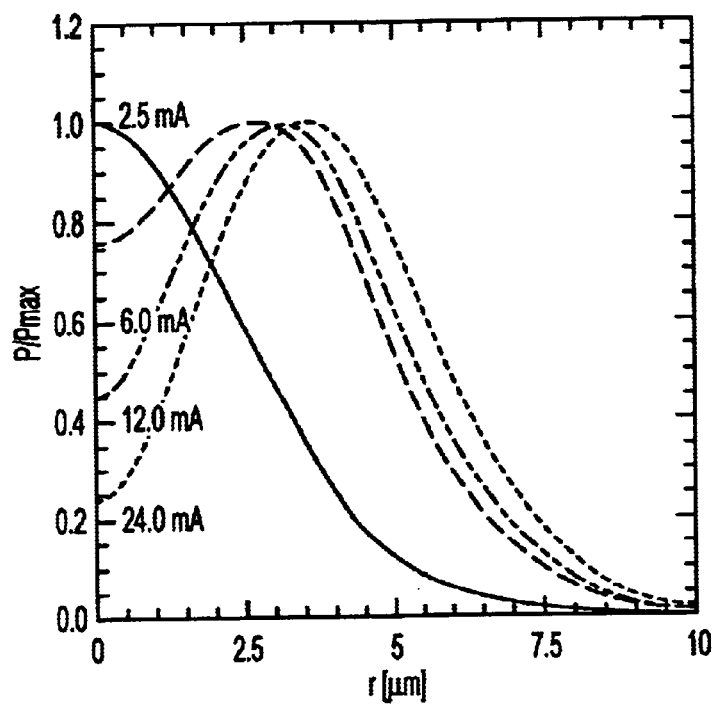
FIGS. 5A and 5B are graphs which illustrate, respectively, the relative light power P/Pmax vs. cavity radius r for various operating currents and the relative carrier density $N/N_0$ vs. cavity radius r at various operating currents, respectively, for a conventional VCSEL.
Figure 5B:
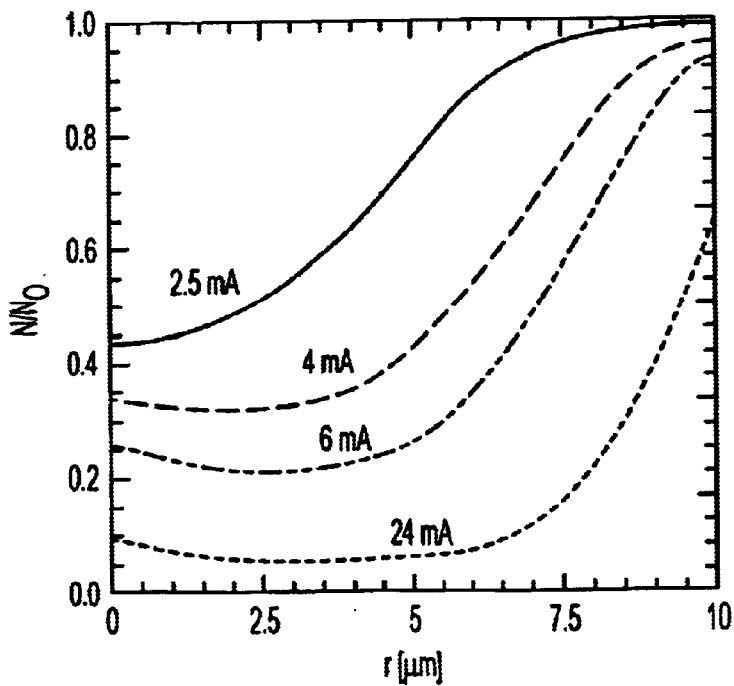

FIGS. 5A and 5B show (a) the light intensity P/Pmax and (b) the carrier density distribution N/N, respectively, for a conventional VCSEL with a 20 micron diameter operating at 850 nm wavelength. Different curves correspond to different currents through the device. The start-up (threshold) lasing current is about 1.50 mA.

FIG. 5A illustrates how the radiation intensity profile for the conventional VCSEL varies from the fundamental mode (peaked on axis) at 2 mA, to a higher, off-axis peaked mode at 6 mA, that is, at only four times above the threshold current as it varies for the radius from the center (axis) of the VCSEL cylinder. Significant admixtures of the higher mode are present in the light profile from currents of 4 mA and greater.

FIG. 5B illustrates the correlation between mode switching and carrier density depletion for a conventional VCSEL as it varies with radius from the VCSEL cylinder center (axis). The axial hole in the carrier density grows deeper and wider, triggering more lasing action in the circumference rather than on axis.

Figure 6A:
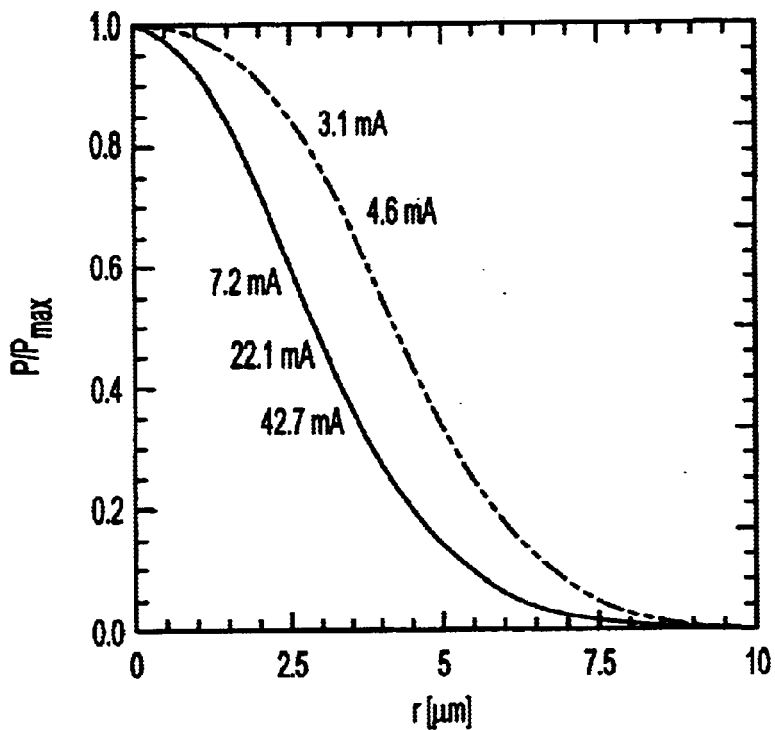
FIGS. 6A and 6B are graphs which illustrate, respectively, the relative light power P/Pmax vs. cavity radius r at various operating currents and the relative carrier density $N/N_0$ vs. cavity radius r at various operating currents for a photocurrent feedback VCSEL according to the present invention.
Figure 6B:
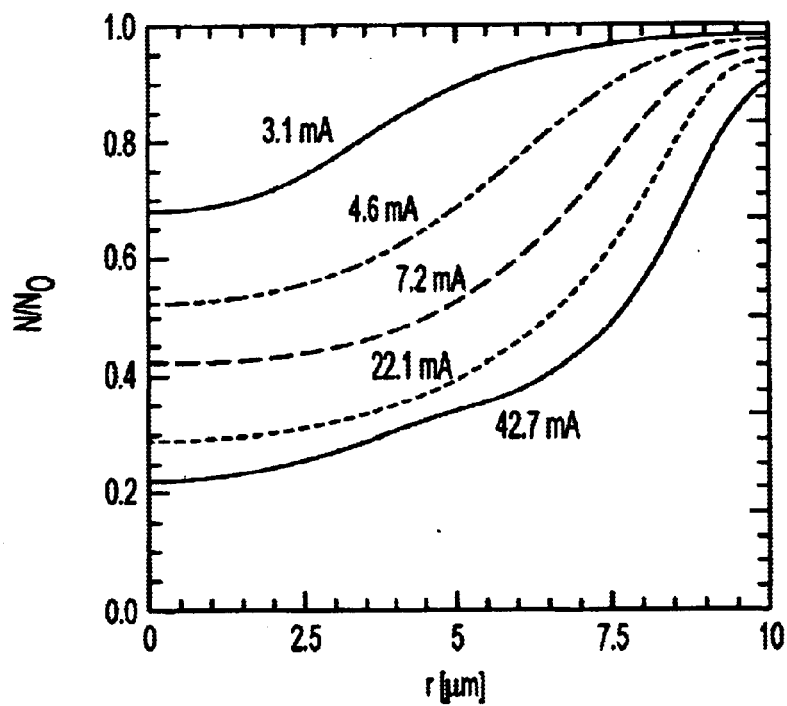

FIG. 6A and 6B plot the operation of the same dimension VCSEL including a single photoactive layer material as per the invention. As expected, the intensity profile in FIG. 6A remains sharply peaked on axis, the signature of fundamental mode operation, for up to greater than 40 mA operating current; i.e., the VCSEL operates in a single mode at currents of over twenty times the lasing threshold current. Much lower carrier depletion is observed on axis for an inventive VCSEL as shown in FIG. 6B, in comparison to that in FIG. 5B for the conventional VCSEL.

Figure 7A:
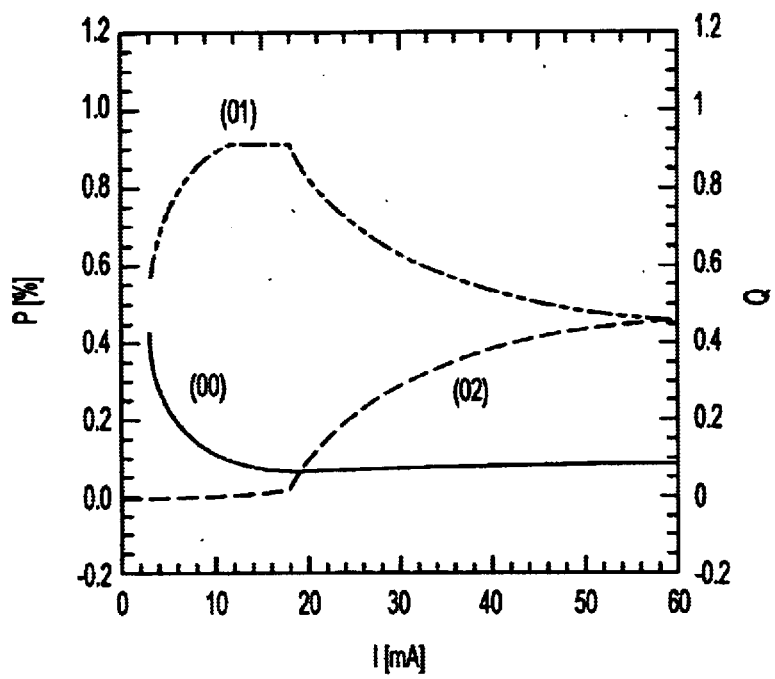
FIGS. 7A and 7B are graphs which illustrate the relative intensity of cavity modes P[%] present in the output of a VCSEL vs. operating current I from numerical simulation for a conventional VCSEL and a photocurrent feedback VCSEL according to the present invention, respectively, where (00) is the fundamental and a second mode (01) and a third mode (02), are higher cavity modes.
Figure 7B:
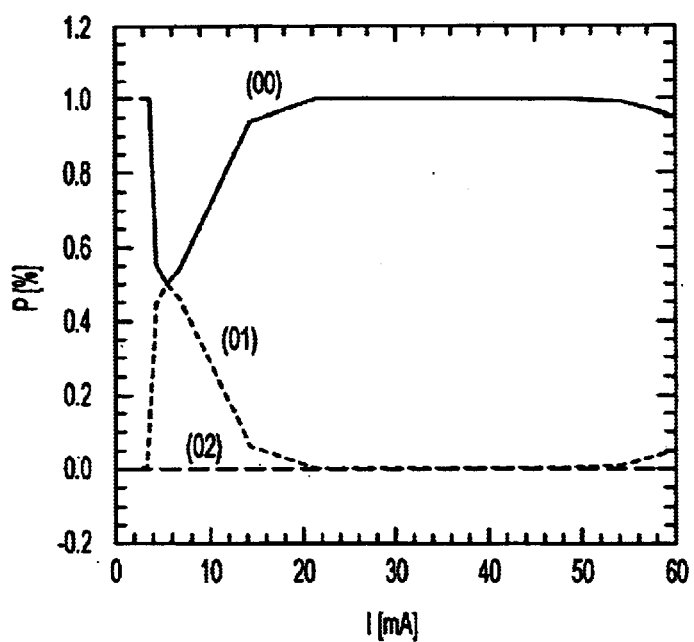

The performance improvement in the VCSEL including a photoactive layer, due to photocurrent, relative to the conventional VCSEL is obvious by comparing the laser intensity distribution (%) in each cavity mode vs. current, as shown in FIGS. 7A and 7B, without and with photo-current feedback, respectively. In general, it is understood that the best mode of operation in a VCSEL is the fundamental mode (00), which provides illumination peaked on axis. In the conventional VCSEL example, FIG. 7A, a three-mode mixture develops which includes the fundamental mode (00), a second cavity mode (01), and a third cavity mode (02). While at current levels just above the lasing threshold, the fundamental mode dominates (not illustrated). However, just above 12 mA the second mode dominates and above 24 mA the third cavity mode (peaked further off axis) dominates.

On the other hand, in the VCSEL having photocurrent feedback of the present invention, FIG. 7B, essentially single mode operation persists to above 60 mA with the fundamental cavity mode (00) dominates; in fact the modal purity is improved at higher than modest currents. However, the presented example is by no means the best possible result, since the operation parameter space has not yet been explored in detail.

Figure 8A:
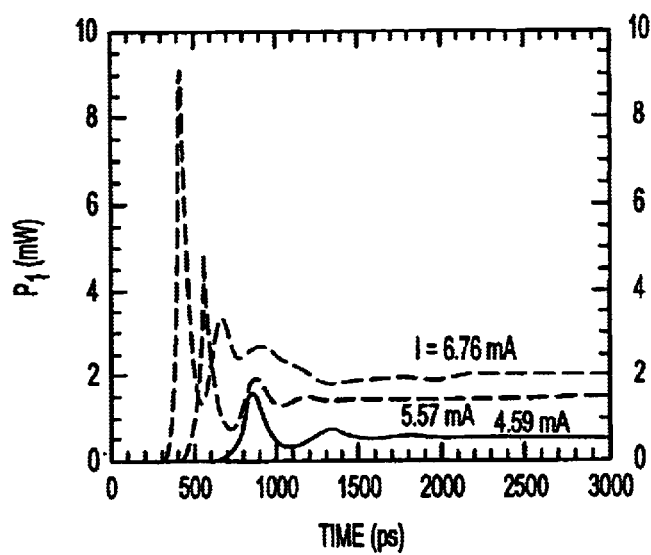
FIGS. 8A, 8B and 8C are graphs that illustrate the form of the laser start-up output pulse in time, following the application of constant bias voltage at time zero.
Figure 8B:
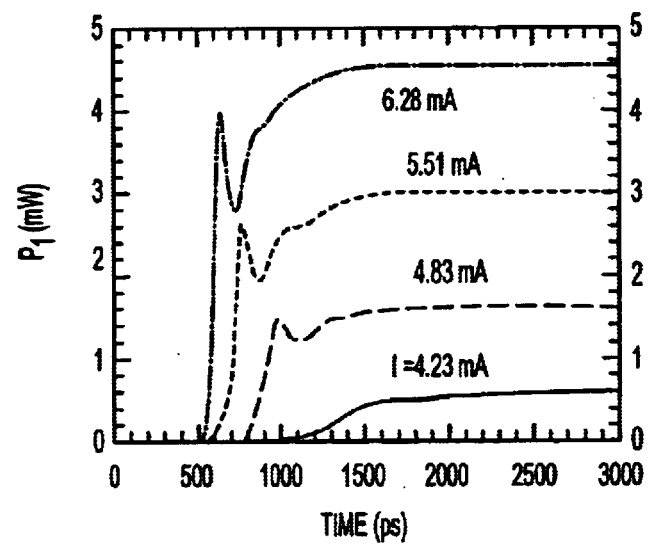
Figure 8C:
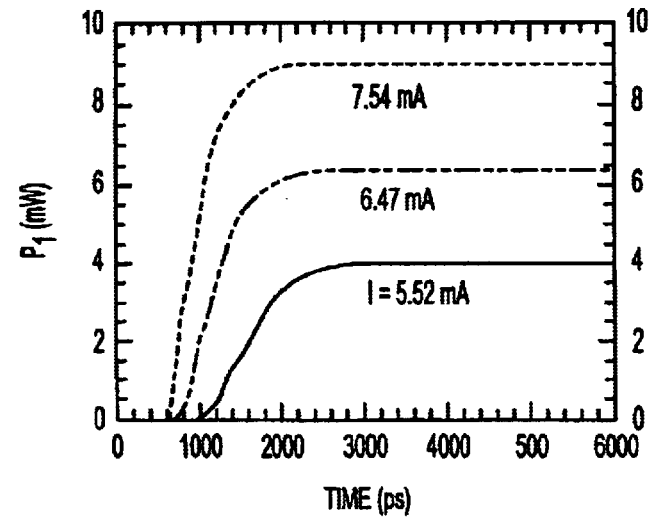

In addition, the present invention provides reduction or elimination of the initial power spike and power modulation during the laser start-up phase, by the use of photoactive layers, is illustrated in FIGS. 8A, 8B and 8C. These figures plot the laser start-up output pulse in time following the application of constant bias voltage at time zero. FIG. 8A shows the pulse for conventional laser operation, with an undesired "spike" in the output power and subsequent oscillatory relaxation to the final constant power steady-state. Different curves correspond to different applied biases and junction currents. FIG. 8B shows that VCSEL operation with one pair of photoactive layers has a drastic reduction in the spike with elimination of oscillations. FIG. 8C shows that VCSEL operation with two pairs of photoactive layers eliminates the spiking completely. One skilled in the art will understand that even adding a single photoactive layer in either Bragg mirror 1 or Bragg mirror 2 will reduce the undesired spike in the output power at laser start-up (turn on) and thereby improve the semiconductor laser operation.

Similar to optimizing for single mode operation, particular thickness and location of the photoactive layer(s) can be determined to optimize the reduction of the initial power spike during laser turn on and reduction of the optical tail after laser turn off by using similar equations solved in an iterative manner.

The present invention provides a single mode high power VCSEL including a photoactive layer(s) that can be useful for a wide variety of applications as previously discussed. One such application is the use of the invented VCSEL for optical writing in an optical storage read/write device.

Although particular embodiments of the present invention have been shown and described, it will be understood that it is not intended to limit the invention to the preferred embodiment(s). It will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims.

For example, the present invention is applicable to almost any currently known VCSEL cavity design. As such it impacts any optoelectronic device using a VCSEL or VCSEL array, including, but not limited to: THz bandwidth electronic interconnects, optical amplifiers required in optical fiber telecommunications, optical read/write in CDs and other optical storage devices, and flat VCSEL-based display panels.

Furthermore, assuming other semiconductor materials, for example silicon, can be constructed to act as an optoelectronic light source, the present invention is also applicable to the other semiconductor material based light sources to overcome carrier depletion problems. The invention is particularly useful in semiconductor laser applications.

What is claimed is:

1. A light source comprising:
a first Bragg mirror comprising a plurality of n-doped semiconductor layers;
a second Bragg mirror comprising a plurality of p-doped semiconductor layers;
an active layer formed between said plurality of n-doped semiconductor layers and said plurality of p-doped semiconductor layers; and
a photoresistive layer that provides photocurrent feedback by increasing a current density in the active layer by decreasing its resistance in response to light emitted from the active layer,
wherein said photoresistive layer is disposed within the light source either between the first and second Bragg mirrors or within one or both of the first and second Bragg mirrors, and
wherein the photoresistive layer regulates current passing through the light source by decreasing its resistance in response to light emitted from the active layer.

2. The light source according to claim 1, wherein said photoresistive layer is comprised of a material selected from the group consisting of high band gap $Ga_{1-x}Al_xAs$, amorphous $Ga_{1-x}Al_xAs$, undoped GaAs, Ge, GeSi, and ZnSe.

3. The light source according to claim 1, wherein said photoresistive layer is formed of a predetermined thickness and at a location so as to reduce carrier depletion in said light source; reduce spiking and power modulation in optical laser pulses when the light source is turned on; and reduce tails in optical laser pulses after the light source is turned off.

4. The light source according to claim 1, wherein said photoresistive layer is positioned so as to prevent mode switching.

5. The light source according to claim 1, further comprising another photoresistive layer optically coupled to the active layer and located within the light source so as to provide photocurrent feedback.

6. The light source according to claim 1, wherein said photoresistive layer is formed within said plurality of n-doped semiconductor layers.

7. The light source according to claim 1, wherein said photoresistive layer is located within said light source so as to minimize premature photocurrent saturation and current clipping.

8. The light source according to claim 1, wherein said photoresistive layer is located within said light source where a minimum of a light intensity occurs.

9. The light source according to claim 8, further comprising another photoresistive layer optically coupled to the active layer and located within the light source so as to provide photocurrent feedback.

10. An apparatus comprising:
a plurality of n-doped semiconductor layers;
a plurality of p-doped semiconductor layers;
an active region formed between said plurality of n-doped semiconductor layers and said plurality of p-doped semiconductor layers; and
a photoresistive layer that provides photocurrent feedback by increasing a current density in the active region by decreasing its resistance in response to light emitted from the active region, wherein said photoresistive layer is disposed within the apparatus either between the plurality of n-doped semiconductor layers and the plurality of p-doped semiconductor layers or within one or both of the plurality of n-doped semiconductor layers and the p-doped semiconductor layers, and wherein the photoresistive layer regulates current through the apparatus by decreasing its resistance in response to light emitted from the active region.

11. The apparatus according to claim 10, wherein said apparatus is a laser light source.

12. The apparatus according to claim 11, wherein said plurality of n-doped semiconductor layers are a periodic sequence of alternating N-$Al_xGa_{1-x}As$ and N-$Al_yGa_{1-y}As$ and said plurality of p-doped semiconductor layers are a periodic sequence of alternating P-$Al_xGa_{1-x}As$ and P-$Al_yGa_{1-y}As$.

13. The apparatus according to claim 11, further comprising another photoresistive layer optically coupled to the active layer and located within the light source so as to provide photocurrent feedback.

14. The apparatus according to claim 13, wherein said photoresistive layer is formed within said plurality of n-doped semiconductor layers and said another photoresistive layer is formed within said plurality of p-doped semiconductor layers.

15. The apparatus according to claim 13, wherein said photoresistive layer and said another photoresistive layer are formed at locations in said laser light source so as to provide sufficient photocurrent feedback to reduce premature photocurrent saturation and current clipping and thereby prevent mode switching to undesirable modes.

16. The apparatus according to claim 11, wherein said photoresistive layer is formed of a thickness and at a location so as to reduce carrier depletion in said laser light source; reduce spiking and power modulation in optical laser pulses when the laser light source is turned on; and reduce tails in optical laser pulses after the laser light source is turned off.

17. The apparatus according to claim 10, wherein said photoresistive layer is comprised of a material selected from the group consisting of high band gap $Ga_{1-x}Al_xAs$, amorphous $Ga_{1-x}Al_xAs$, undoped GaAs, Ge, GeSi, and ZnSe.

18. An apparatus comprising:

a first Bragg mirror comprising a plurality of n-doped semiconductor layers;

a second Bragg mirror comprising a plurality of p-doped semiconductor layers;

an active layer formed between said plurality of n-doped semiconductor layers and said plurality of p-doped semiconductor layers; and a photoresistive means for providing photocurrent feedback by increasing a current density in the active layer by decreasing a resistance in response to light emitted from the active layer, wherein said photoresistive means is disposed within the apparatus either between the first and second Bragg mirrors or within one or both of the first and second Bragg mirrors, and wherein the photoresistive means regulates current through the apparatus in response to decreases in its resistance.

19. The apparatus according to claim 18, wherein said photoresistive means for providing photocurrent feedback is formed at a location to further provide single mode operation and reduce optical tails.

20. The apparatus according to claim 18, wherein said photoresistive means for providing photocurrent feedback to is comprised of a material selected from the group consisting of high band gap $Ga_{1-x}Al_xAs$, amorphous $Ga_{1-x}A_xAx$, undoped GaAs, Ge, GeSi, and ZnSe.

21. The apparatus according to claim 18, wherein said photoresistive means for providing photocurrent feedback is located between the active layer and the first Bragg mirror.

22. The apparatus according to claim 18, wherein said photoresistive means for providing photocurrent feedback is located within the plurality of n-doped semiconductor layers.

23. The apparatus according to claim 18, wherein said photoresistive means for providing photocurrent feedback is located within the plurality of p-doped semiconductor layers.

24. The light source according to claim 1, wherein said photoresistive layer is located between the active layer and the plurality of n-doped semiconductor layers.

25. The light source according to claim 1, wherein said photoresistive layer is located within the plurality of n-doped semiconductor layers and another photoresistive layer is located within the plurality of p-doped semiconductor layers.

26. The apparatus according to claim 18, wherein a thickness of said photoresistive means for providing photocurrent feedback is approximately 0.1 $\mu$m.

27. The light source according to claim 1, wherein a thickness of said photoresistive layer is approximately 0.1 $\mu$m.

* * * * *

UNITED STATES PATENT AND TRADEMARK OFFICE
CERTIFICATE OF CORRECTION

PATENT NO. : 6,795,470 B1 Page 1 of 1
DATED : September 21, 2004
INVENTOR(S) : Spilios Riyopoulos It is certified that error appears in the above-identified patent and that said Letters Patent is hereby corrected as shown below:

Title page,
Item [75], Inventors, replace "Riyopoulos Spilios" with -- Spilios Riyopoulos --.

Signed and Sealed this

Tenth Day of January, 2006

JON W. DUDAS
*Director of the United States Patent and Trademark Office*